(12) United States Patent
Ikeuchi et al.

(10) Patent No.: US 8,461,059 B2
(45) Date of Patent: Jun. 11, 2013

(54) BATCH CVD METHOD AND APPARATUS FOR SEMICONDUCTOR PROCESS

(75) Inventors: Toshiyuki Ikeuchi, Nirasaki (JP);
Masayuki Hasegawa, Nirasaki (JP);
Toshihiko Takahashi, Nirasaki (JP);
Keisuke Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 12/838,911

(22) Filed: Jul. 19, 2010

(65) Prior Publication Data
US 2011/0021033 A1    Jan. 27, 2011

(30) Foreign Application Priority Data
Jul. 22, 2009  (JP) .................................. 2009-171557

(51) Int. Cl.
*H01L 21/473* (2006.01)
(52) U.S. Cl.
USPC ..................... 438/778; 438/785; 257/E21.272
(58) Field of Classification Search
USPC .......................................... 438/778, 785, 787
See application file for complete search history.

(56) References Cited

U.S. PATENT DOCUMENTS

| | | | |
|---|---|---|---|
| 7,351,668 B2* | 4/2008 | Chou et al. | 438/770 |
| 7,442,604 B2* | 10/2008 | Choi et al. | 438/240 |
| 7,713,884 B2* | 5/2010 | Ito et al. | 438/778 |
| 7,758,920 B2* | 7/2010 | Hasebe et al. | 427/248.1 |
| 2004/0187777 A1* | 9/2004 | Okamoto et al. | 118/715 |
| 2009/0035951 A1* | 2/2009 | Miya et al. | 438/787 |
| 2009/0187777 A1* | 7/2009 | Clark | 713/320 |

FOREIGN PATENT DOCUMENTS

| | | |
|---|---|---|
| JP | 9-77593 | 3/1997 |
| JP | 2004-6801 | 1/2004 |
| JP | 2005-175441 | 6/2005 |

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

A batch CVD method repeats a cycle including adsorption and reaction steps along with a step of removing residual gas. The adsorption step is preformed while supplying the source gas into the process container by first setting the source gas valve open for a first period and then setting the source gas valve closed, without supplying the reactive gas into the process container by keeping the reactive gas valve closed, and without exhausting gas from inside the process container by keeping the exhaust valve closed. The reaction step is performed without supplying the source gas into the process container by keeping the source gas valve closed, while supplying the reactive gas into the process container by setting the reactive gas valve open, and exhausting gas from inside the process container by setting the exhaust valve to gradually decrease its valve opening degree from a predetermined open state.

15 Claims, 5 Drawing Sheets

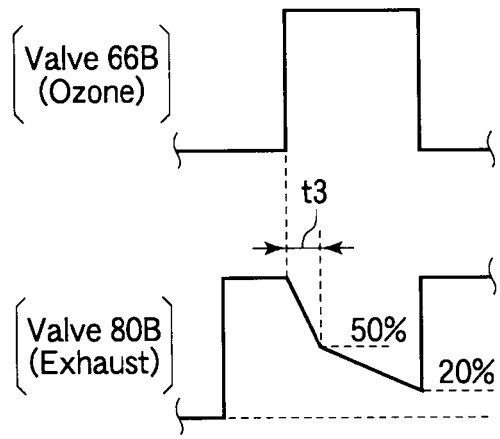 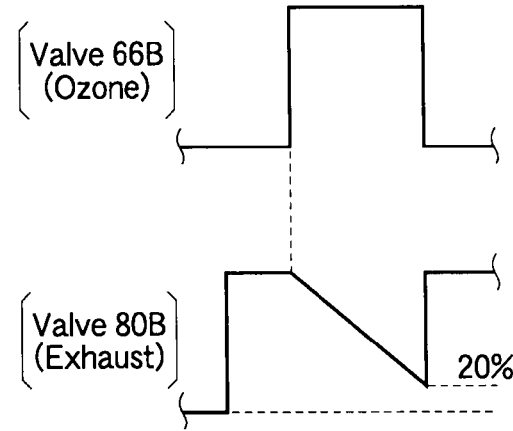
FIG.3A     FIG.3B
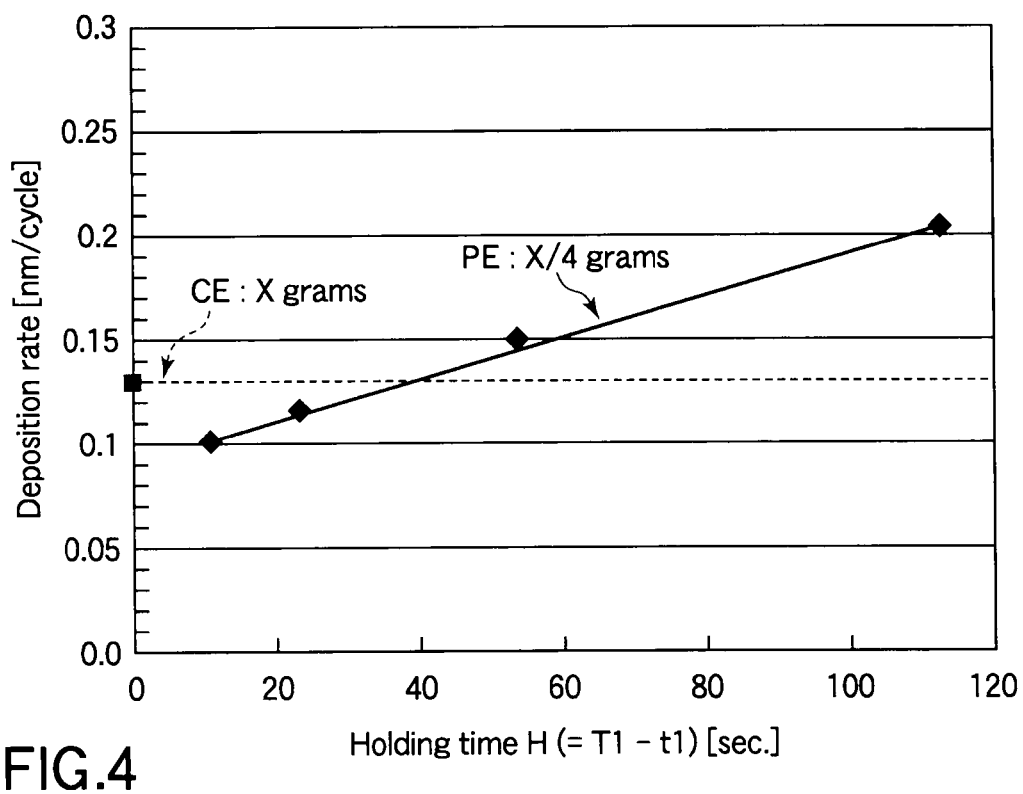
FIG.4

BATCH CVD METHOD AND APPARATUS FOR SEMICONDUCTOR PROCESS

CROSS-REFERENCE TO RELATED PATENT APPLICATIONS

This application claims the benefit of priority from Japanese Patent Application No. 2009-171557, filed on Jul. 22, 2009 in the Japan Patent Office, the disclosure of which is incorporated herein in the entirety by reference.

BACKGROUND OF THE INVENTION

1. Field of the Invention

The present invention relates to a batch CVD (chemical vapor deposition) method and apparatus, and particularly to a semiconductor processing technique for forming a product film on target objects, such as semiconductor wafers. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In manufacturing semiconductor devices for constituting semiconductor integrated circuits, a target object, such as a semiconductor wafer, is subjected to various processes, such as film formation, etching, oxidation, diffusion, and reformation. Film formation processes of this kind are performed in film formation apparatuses of the single-substrate type, such as an apparatus disclosed in Jpn. Pat. Appln. KOKAI Publication No. 09-077593, and film formation apparatuses of the batch type, such as an apparatus disclosed in Jpn. Pat. Appln. KOKAI Publication No. 2004-006801.

FIG. 5 is a structural view schematically showing a conventional batch CVD apparatus. For example, where a silicon oxide film is formed, a wafer boat 4 holding target objects or semiconductor wafers W at intervals in the vertical direction is loaded into a vertical process container 2. The wafers W are heated to a predetermined temperature, such as about 600° C., by a heater 6 disposed around the process container 2. A silicon source gas and a reactive gas, such as ozone, are supplied from a gas supply system 8. These gases are delivered into the process container 2 from a number of gas spouting holes 8A and 10A formed on distribution nozzles 8 and 10 vertically extending inside the process container 2. Further, the inner space of the process container 2 is vacuum-exhausted by a vacuum exhaust system 14 including a vacuum pump 16 through an exhaust port 12 formed at the lower side of the process container 2. Under these conditions, a process for forming a silicon oxide film is performed inside the process container 2 with a predetermined pressure kept therein.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD method for a film formation process, which performs film formation while intermittently supplying a source gas and so forth to repeatedly form layers each having an atomic or molecular level thickness, one by one, or several by several. In general, this film formation process is called ALD (Atomic layer Deposition) or MLD (Molecular Layer Deposition), which allows a predetermined process to be performed without exposing wafers to a very high temperature.

Where a silicon oxide film is formed by ALD or MLD using the apparatus shown in FIG. 5, operations are performed as follows. Specifically, a switching valve 8B for a silicon source gas and a switching valve 10B for ozone serving as an oxidizing gas are operated to alternately supply the silicon source gas and oxidizing gas. Further, the exhaust valve 14B of the vacuum exhaust system 14 is operated to adjust its valve opening degree to control the pressure inside process container 2.

FIG. 6 is a graph showing the relationship between the valve states and the pressure inside the process container where a silicon oxide film is formed by ALD using the apparatus shown in FIG. 5. FIG. 6, (A), shows the state of the source gas switching valve 8B, FIG. 6, (B), shows the state of the reactive gas switching valve 10B, FIG. 6, (C), shows the state (valve opening degree) of the exhaust valve 14B of the vacuum exhaust system, and FIG. 6, (D), shows the pressure inside the process container.

According to the method shown in FIG. 6, a cycle comprising an adsorption step T11, an exhaust step T12, a reaction step T13, and an exhaust step T14 in this order is repeated a plurality of times. In the adsorption step T11, as shown in FIG. 6, (A), the source gas switching valve 8B is set open to supply the silicon source gas, so that this gas is adsorbed on the surface of the wafers W. In the reaction step T13, as shown in FIG. 6, (B), the reactive gas switching valve 10B is set open to supply the reactive gas or ozone, so that the ozone reacts with the source gas adsorbed on the surface of the wafers, thereby forming a thin $SiO_2$ film. In the exhaust steps T12 and T14, the exhaust valve 14B is set open to exhaust gas from inside the process container 2, without supplying either of the source gas and reactive gas.

By performing one cycle, a thin film having an atomic or molecular level thickness is formed. Thin films formed by respective times in repetition of the cycle are laminated so that a product film having a predetermined thickness is formed. In one cycle, the time length of each of the adsorption step T11 and reaction step T13 is about 60 seconds, and the time length of each of the exhaust steps T12 and T14 is about 10 seconds. This batch CVD method allows the process to be performed without exposing wafers to a very high temperature. However, as described later, the present inventors have found that batch CVD methods of this kind have room for improvement in terms of some characteristics thereof concerning the film quality, throughput, and source gas consumption.

BRIEF SUMMARY OF THE INVENTION

An object of the present invention is to provide a batch CVD method and apparatus having improved characteristics concerning the film quality, throughput, and source gas consumption.

According to a first aspect of the present invention, there is provided a batch CVD (chemical vapor deposition) method for a semiconductor process in a batch CVD apparatus, the apparatus comprising a vertically long process container configured to accommodate a plurality of target objects, a holder configured to support the target objects at intervals in a vertical direction inside the process container, a source gas supply system configured to supply a source gas into the process container, the source gas supply system including a source gas valve for adjusting supply of the source gas, a reactive gas supply system configured to supply a reactive gas into the process container, the reactive gas supply system including a reactive gas valve for adjusting supply of the reactive gas, and an exhaust system configured to exhaust gas from inside the process container, the exhaust system including an exhaust valve for adjusting an exhaust rate, the method being preset to repeat a cycle a plurality of times to laminate thin films formed by respective times and thereby to form a product film having a predetermined thickness on the target objects, the cycle comprising: an adsorption step of adsorbing the source gas onto the target objects, while supplying the source gas into the process container by first setting the source gas valve open for a first period and then setting the source gas valve closed, without supplying the reactive gas into the process container by keeping the reactive gas valve closed, and without exhausting gas from inside the process container by keeping the exhaust valve closed; then, a first intermediate step of removing residual gas from inside the process container, without supplying either of the source gas and the reactive gas into the process container by keeping both of the source gas valve and the reactive gas valve closed, while exhausting gas from inside the process container by setting the exhaust valve open; then, a reaction step of causing the reactive gas to react with the source gas adsorbed on the target objects, without supplying the source gas into the process container by keeping the source gas valve closed, while supplying the reactive gas into the process container by setting the reactive gas valve open, and exhausting gas from inside the process container by setting the exhaust valve to gradually decrease its valve opening degree from a predetermined open state; and then, a second intermediate step of removing residual gas from inside the process container, without supplying either of the source gas and the reactive gas into the process container by keeping both of the source gas valve and the reactive gas valve closed, while exhausting gas from inside the process container by setting the exhaust valve to have a valve opening degree larger than that at end of the reaction step.

According to a second aspect of the present invention, there is provided a computer readable storage medium containing program instructions for execution on a processor, which, when executed by the processor, control a batch CVD apparatus to perform a method according to the first aspect.

According to a third aspect of the present invention, there is provided a batch CVD (chemical vapor deposition) apparatus for a semiconductor process, the apparatus comprising: a vertically long process container configured to accommodate a plurality of target objects; a holder configured to support the target objects at intervals in a vertical direction inside the process container; a source gas supply system configured to supply a source gas into the process container, the source gas supply system including a source gas valve for adjusting supply of the source gas; a reactive gas supply system configured to supply a reactive gas into the process container, the reactive gas supply system including a reactive gas valve for adjusting supply of the reactive gas; an exhaust system configured to exhaust gas from inside the process container, the exhaust system including an exhaust valve for adjusting an exhaust rate; and a control section configured to control an operation of the apparatus, wherein the control section is preset to execute a batch CVD method, which repeats a cycle a plurality of times to laminate thin films formed by respective times and thereby to form a product film having a predetermined thickness on the target objects, the cycle comprising an adsorption step of adsorbing the source gas onto the target objects, while supplying the source gas into the process container by first setting the source gas valve open for a first period and then setting the source gas valve closed, without supplying the reactive gas into the process container by keeping the reactive gas valve closed, and without exhausting gas from inside the process container by keeping the exhaust valve closed, then, a first intermediate step of removing residual gas from inside the process container, without supplying either of the source gas and the reactive gas into the process container by keeping both of the source gas valve and the reactive gas valve closed, while exhausting gas from inside the process container by setting the exhaust valve open, then, a reaction step of causing the reactive gas to react with the source gas adsorbed on the target objects, without supplying the source gas into the process container by keeping the source gas valve closed, while supplying the reactive gas into the process container by setting the reactive gas valve open, and exhausting gas from inside the process container by setting the exhaust valve to gradually decrease its valve opening degree from a predetermined open state, and then, a second intermediate step of removing residual gas from inside the process container, without supplying either of the source gas and the reactive gas into the process container by keeping both of the source gas valve and the reactive gas valve closed, while exhausting gas from inside the process container by setting the exhaust valve to have a valve opening degree larger than that at end of the reaction step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are views showing two modifications of the reaction step, in terms of a change in the valve opening degree of the exhaust valve of the vacuum exhaust system;

FIG. 4 is a graph showing results of an experiment associated with the embodiment;

DETAILED DESCRIPTION OF THE INVENTION

In the process of developing the present invention, the inventors studied problems with regard to conventional batch CVD methods and apparatuses for a semiconductor process of this kind. As a result, the inventors have arrived at the findings given below.

Figure 5:
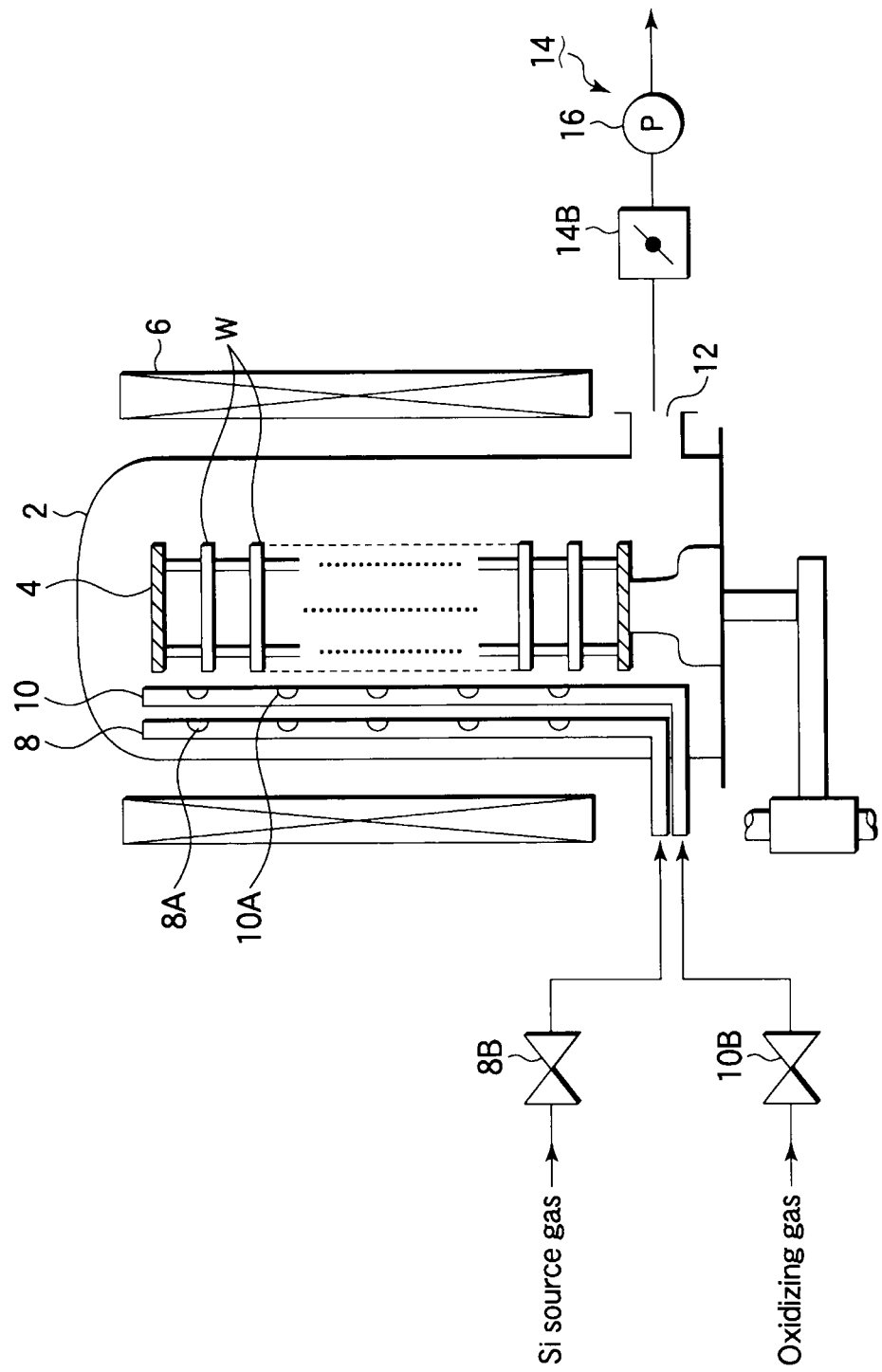
FIG. 5 is a structural view schematically showing a conventional batch CVD apparatus.
Figure 6:
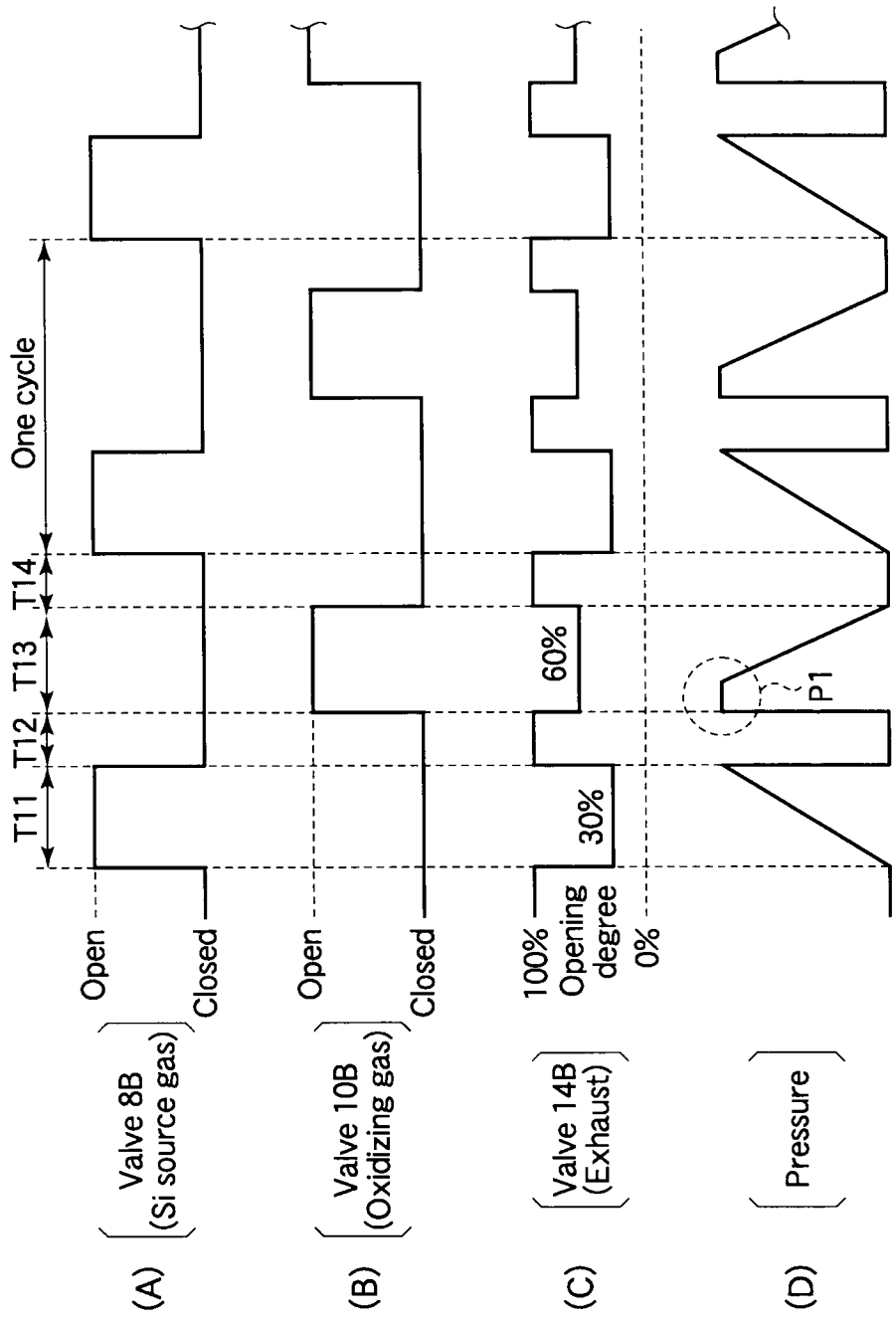
FIG. 6 is a graph showing the relationship between the valve states and the pressure inside the process container where a silicon oxide film is formed by ALD using the apparatus shown in FIG. 5.

The method described above with reference to FIGS. 5 and 6 is arranged in accordance with a conventional concept such that, when a silicon source gas is supplied in the adsorption step T11, it is preferable to form flows of the source gas on or above the surface of the wafers because the amount of source gas to be adsorbed on the surface of wafers is thereby increased. For this reason, in the adsorption step T11, as shown in FIG. 6, (C), the exhaust valve 14B of the vacuum exhaust system 14 is set open at some level, such as a valve opening degree of about 30%, so as to exhaust gas to a certain degree to form flows of the source gas on or above the surface of the wafers. In this case, since the source gas is set at a flow rate of about 10 to 500 sccm (standard cubic centimeter per minutes), the pressure inside the process container 2 is gradually and linearly increased, as shown in FIG. 6, (D).

On the other hand, in the reaction step T13, the exhaust valve 14B is set more open than the adsorption step T11 described above, such as a valve opening degree of about 60%, so as to efficiently cause the reaction. In this case, since the ozone is set at a flow rate of about 20 slm (standard liter per minute), which is far larger than the flow rate of the source gas, the pressure inside the process container 2 is first increased in an instant and saturated for a while by the ozone supply, and is then gradually decreased. Further, in the exhaust steps T12 and T14, the exhaust valve 14B is set at a valve opening degree of 100% to perform forcible vacuum-exhaust, so as to swiftly remove residual gas from inside the process container 2. The vacuum pump 16 is kept running through all the steps.

However, according to the conventional method described above, the exhaust valve 14B is set open to a certain degree to keep the silicon source gas flowing during the adsorption step T11. Consequently, the source gas is consumed by a large amount, and the running cost becomes significantly higher particularly where the source gas is expensive.

Further, in the reaction step T13, the pressure inside the process container 2 is first increased by the ozone supply, to a point P1 shown in FIG. 6, (D), which is excessively high for the ozone such that the ozone can be easily deactivated while losing its activity. Consequently, the film formation proceeds sufficiently on the peripheral part of the wafers, but proceeds insufficiently on the central part of the wafers, due to inadequate supply of the ozone, thereby deteriorating the planar uniformity of the film thickness. Particularly, where the surface of the wafers includes a trench structure, this brings about a prominent loading effect that drastically increases the ozone consumption while making the film thickness very small on the wafer central part. In this respect, there may be a countermeasure of setting the pressure inside the process container 2 much lower in the reaction step T13, but this countermeasure is undesirable because the deposition rate drops to a great extent along with a decrease in the pressure, thereby lowering the throughput.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
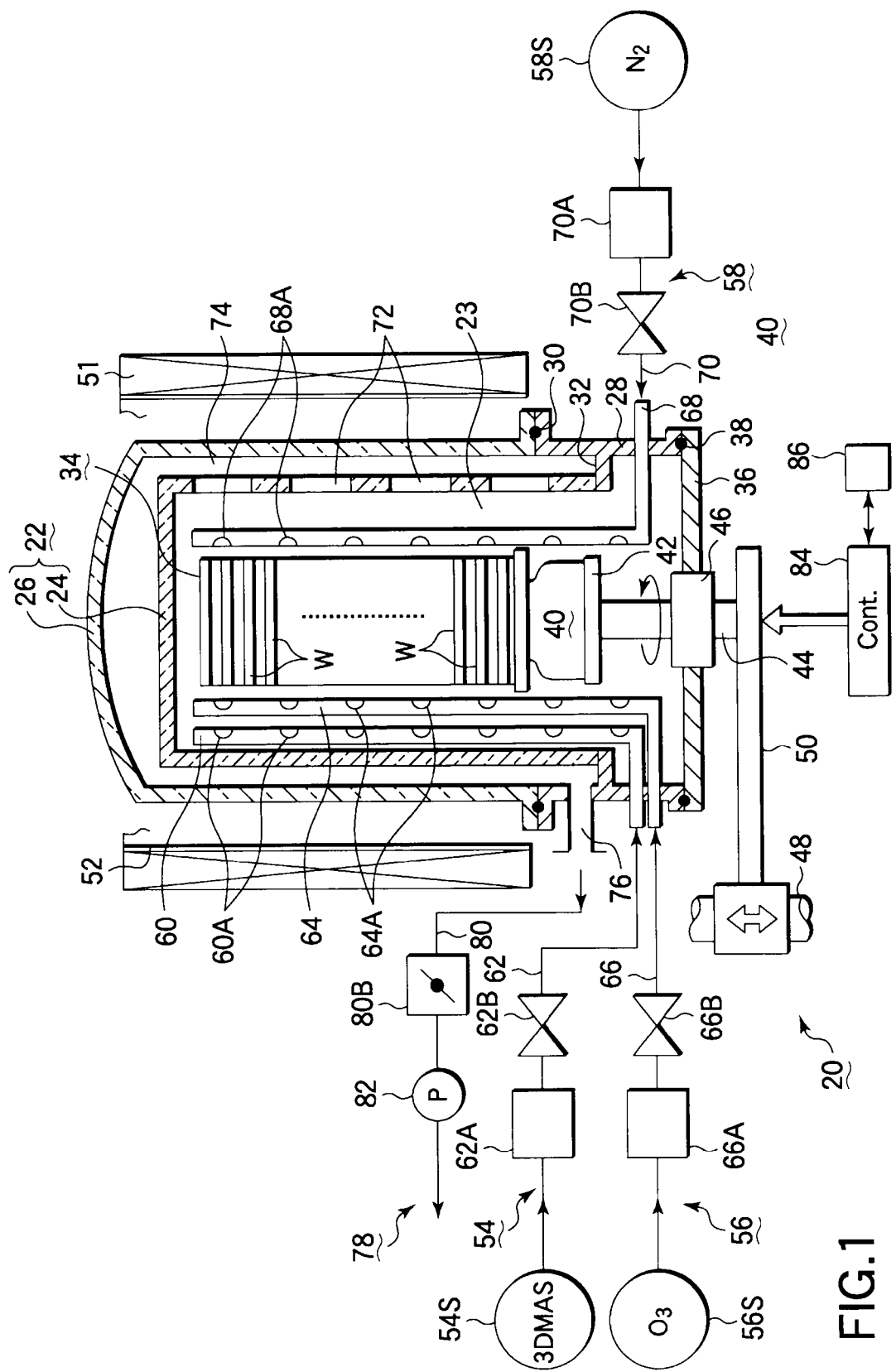
FIG. 1 is a structural view schematically showing a batch CVD apparatus according to an embodiment of the present invention.

FIG. 1 is a structural view schematically showing a batch CVD apparatus according to an embodiment of the present invention. This apparatus is designed to form a thin film or silicon oxide film ($SiO_2$) by use of a source gas comprising 3DMAS (trisdimethylamino silane), which is a Si-containing organic material, and a reactive gas comprising ozone, which is an oxidizing gas, (practically a gas mixture of $O_3$ and $O_2$).

As shown in FIG. 1, this film formation apparatus 20 includes a process container 22, in which a process field 23 is defined to accommodate and process a plurality of semiconductor wafers (target objects) stacked at intervals in the vertical direction. The process container 22 has a double tube structure comprising an inner tube 24 and an outer tube 26, both of which are vertically long tubes. The inner tube 24 is shaped as a cylindrical column with a ceiling and an opened bottom, in which the process field 23 is defined. The outer tube 26 is shaped as a cylindrical column with a ceiling and an opened bottom and surrounds the inner tube 24 with a predetermined gap interposed therebetween. The inner tube 24 and outer tube 26 are made of quartz.

The process container 22 has a diameter of, e.g., about 400 to 500 mm for accommodating wafers W having a diameter of 300 mm. The inner volume of the process container 22 depends on the number of wafers W to be loaded therein, and is set at, e.g., about 200 liters for accommodating 150 wafers W at most.

The bottom of the outer tube 26 is airtightly connected through a seal member 30, such as an O-ring, to a cylindrical manifold 28 made of, e.g., stainless steel. The bottom of the outer tube 26 is supported by the manifold 28, while the manifold 28 is supported by a base plate (not shown). The manifold 28 includes a ring support 32 extending from its inner surface, on which the bottom of the inner tube 24 is mounted. A holder or wafer boat 34 made of quartz is placed inside the inner tube 24 of the process container 22.

The wafer boat 34 is moved up and down through the bottom port of the manifold 28, so that the wafer boat 34 is loaded/unloaded into and from the process field 23 of the process container 22. A number of target objects or semiconductor wafers W are stacked on the wafer boat 34. For example, in this embodiment, the wafer boat 34 can support, e.g., about 50 to 100 wafers having a diameter of 300 mm at essentially regular intervals in the vertical direction.

The wafer boat 34 is placed on a table 42 through a heat-insulating cylinder 40 made of quartz. The table 42 is supported by a rotary shaft 44, which penetrates a lid 36 made of, e.g., quartz or stainless steel, and used for opening/closing the bottom port of the manifold 28. The portion of the lid 36 where the rotary shaft 44 penetrates is provided with, e.g., a magnetic-fluid seal 46, so that the rotary shaft 44 is rotatably supported in an airtightly sealed state. A seal member 38, such as an O-ring, is interposed between the periphery of the lid 36 and the bottom of the manifold 28, so that the interior of the process container 22 can be kept sealed.

The rotary shaft 44 is attached at the distal end of an arm 50 supported by an elevating mechanism 48, such as a boat elevator. The elevating mechanism 48 moves the wafer boat 34 and lid 36 up and down together. Further, when the rotary shaft 44 is driven by a rotating mechanism built in the arm 50, the wafer boat 34 is rotated, and so the wafers on the wafer boat 34 are also rotated about a vertical axis extending through their center. However, the table 42 may be fixed to the lid 36, so that wafers W are processed without rotation of the wafer boat 34.

A heat insulating casing 51 is disposed around the process container 22. The heat insulating casing 51 is provided with a heater 52 on the inner surface for heating the atmosphere and wafers W inside the process container 22. For example, the heater 52 is formed of a carbon wire, which causes no contamination and has good characteristics for increasing and decreasing the temperature. A thermocouple (not shown) is disposed inside the inner tube 24 of the process container 22 to control the heater 52.

A gas supply section is connected to the side of the manifold 28 to supply predetermined process gases to the process field 23 of the process container 22. Specifically, the gas supply section includes a source gas supply circuit 54, a reactive gas supply circuit 56, and a purge gas supply circuit 58. The source gas supply circuit 54 is arranged to supply 3DMAS gas as a silicon source gas. The reactive gas supply circuit 56 is arranged to supply ozone gas (practically a gas mixture of $O_3$ and $O_2$) as a reactive gas or oxidizing gas. The purge gas supply circuit 58 is arranged to supply an inactive gas, such as $N_2$ gas, as a purge gas. Each of the source and reactive gases is mixed with a suitable amount of carrier gas, such as $N_2$ gas, as needed. However, such a carrier gas will be mentioned only when necessary, hereinafter, for the sake of simplicity of explanation. The purge gas or carrier gas may be a rare gas, such as Ar or He, in place of $N_2$ gas.

More specifically, the source gas supply circuit 54, reactive gas supply circuit 56, and purge gas supply circuit 58 include gas distribution nozzles 60, 64, and 68, respectively, each of which is formed of a quartz pipe which penetrates the sidewall of the manifold 28 from the outside and then turns and extends upward inside the inner tube 24 (see FIG. 1). The gas distribution nozzles 60, 64, and 68 respectively have a plurality of gas spouting holes 60A, 64A, and 68A, each set of holes being formed at predetermined intervals in the longitudinal direction (the vertical direction) over all the wafers W on the wafer boat 34. Each set of the gas spouting holes 60A, 64A, and 68A deliver the corresponding gas almost uniformly in the horizontal direction, so as to form gas flows parallel with the wafers W on the wafer boat 34, as needed.

The nozzles 60, 64, and 68 are connected to gas sources 54S, 56S, and 58S of 3DMAS gas, $O_3$ gas, and $N_2$ gas, respectively, through gas supply lines (gas passages) 62, 66, and 70, respectively. The gas supply lines 62, 66, and 70 are provided with flow rate controllers 62A, 66A, and 70A, such as mass flow controllers, and switching valves 62B, 66B, and 70B, respectively. With this arrangement, 3DMAS gas, $O_3$ gas, and $N_2$ gas can be supplied at controlled flow rates and selectively supplied and stopped.

The nozzles 60, 64, and 68 are gathered on one side inside the inner tube 24 (though FIG. 1 shows the nozzle 68 as being disposed on the opposite side to the other nozzles 60 and 64 due to limitations of drawing space). The sidewall of the inner tube 24 has a plurality of gas through holes 72 having a large diameter, which are formed therein on the opposite side to the nozzles 60, 64, and 68 and are arrayed in the vertical direction. Each of the gases flowing between the wafers in the horizontal direction passes through the gas through holes 72 into the gap 74 between the inner tube 24 and outer tube 26.

The manifold 28 has an exhaust port 76 formed therein and communicating with the gap 74 between the inner tube 24 and outer tube 26. The exhaust port 76 is connected to a vacuum exhaust system 78 configured to vacuum-exhaust the interior of the process container 22. The vacuum exhaust system 78 has an exhaust line 80 connected to the exhaust port 76, which is provided with a vacuum pump 82 for vacuum-exhausting gas from inside the process container 22 and an exhaust valve 80B for adjusting the pressure inside the process container 22 by changing the valve opening degree. The exhaust valve 80B is configured not only to adjust the valve opening degree to an arbitrary vale but also to switch between the totally open state and the totally closed state to completely shut off the exhaust.

The film formation apparatus 20 further includes a main control section 84 formed of, e.g., a computer, to control the entire apparatus. The main control section 84 can conduct a batch CVD process as described below in accordance with process recipes stored in the storage section 86 thereof in advance, with reference to the film thickness and composition of a film to be formed. In the storage section 86, the relationship between the process gas flow rates and the thickness and composition of the film is also stored as control data in advance. Accordingly, the main control section 84 can control the elevating mechanism 48, gas supply circuits 54, 56, and 58, exhaust system 78, heater 52, and so forth, based on the stored process recipes and control data. Examples of a storage medium are a magnetic disk (flexible disk, hard disk (a representative of which is a hard disk included in the storage section 86), etc.), an optical disk (CD, DVD, etc.), a magneto-optical disk (MO, etc.), and a semiconductor memory.

Next, an explanation will be given of a batch CVD method (so called ALD or MLD film formation) performed in the apparatus shown in FIG. 1. In this batch CVD method, a silicon oxide film is formed on semiconductor wafers by ALD or MLD. In order to achieve this, 3DMAS gas serving as a silicon source gas and ozone ($O_3$) gas serving as an oxidizing reactive gas are selectively supplied to the process field 23 accommodating wafers W. This selective supply is used to alternately repeat a plurality of times an adsorption step of adsorbing 3DMAS gas on the surface of the wafers W and a reaction step of causing ozone gas to react with 3DMAS gas adsorbed on the surface of the wafers W to form a thin film of silicon oxide. Specifically, a film formation process is performed along with the following operations.

When the film formation apparatus 20 is set in standby with no semiconductor wafers W loaded therein, the process field 23 is maintained at a temperature lower than the process temperature. When the process is started, at first, the wafer boat 34 set at room temperature, which supports a number of, such as 50, semiconductor wafers W, is loaded from below into the process field 23 set at a predetermined temperature (the process container 22 is in a hot wall state). Further, the bottom port of the process container 22 is closed by the lid 36 to airtightly seal the process container 22.

Then, the process field 23 is vacuum-exhausted to set the process field 23 at a predetermined process pressure. Further, the power applied to the heater 52 is increased to heat the process field 23 to the process temperature for the film formation process. After the process field 23 is stabilized at the process pressure and process temperature, predetermined process gases necessary for film formation are supplied to the process field 23. In this embodiment, 3DMAS gas and ozone gas are supplied at controlled flow rates respectively from the nozzles 60 and 64 of the gas supply circuits 54 and 56 to the process field 23. Further, the valve opening degree of the exhaust valve 80B of the vacuum exhaust system 78 is adjusted to control the pressure inside the process container 22.

The 3DMAS gas is supplied from the gas spouting holes 60A of the gas distribution nozzle 60 to form gas flows parallel with the wafers W on the wafer boat 34. While being supplied, the 3DMAS gas is activated by the heating temperature to the process field 23, and molecules of the 3DMAS gas and molecules and atoms of decomposition products generated by decomposition are adsorbed on the wafers W.

On the other hand, the ozone gas is supplied from the gas spouting holes 64A of the gas distribution nozzle 64 to form gas flows parallel with the wafers W on the wafer boat 34. While being supplied, the ozone gas is activated by the heating temperature to the process field 23, and molecules of the ozone gas and molecules and atoms of decomposition products generated by decomposition react with decomposition products and so forth derived from the 3DMAS gas and adsorbed on the wafers W. Consequently, a thin film of silicon oxide is formed on the wafers W. Alternatively, when decomposition products and so forth derived from the 3DMAS gas flow onto decomposition products and so forth derived from the ozone gas and adsorbed on the wafers W, the same reaction is caused, so a thin film of silicon oxide is formed on the wafers W.

The exhaust steps are performed between the adsorption step and reaction step described above by exhausting gas from inside the process container 2 without supplying either of the 3DMAS gas and ozone gas. Further, in each of the exhaust steps, $N_2$ gas serving as a purge gas is supplied at a controlled flow rate from the nozzle 68 of the gas supply system 58, as needed. Gas components flowing through the process field 23 passes through the gas through holes 72 into the gap 74 between the inner tube 24 and outer tube 26. Then, these gas components are exhausted by the vacuum exhaust system 78 through the exhaust port 76 located at the bottom of the outer tube 26.

Figure 2:
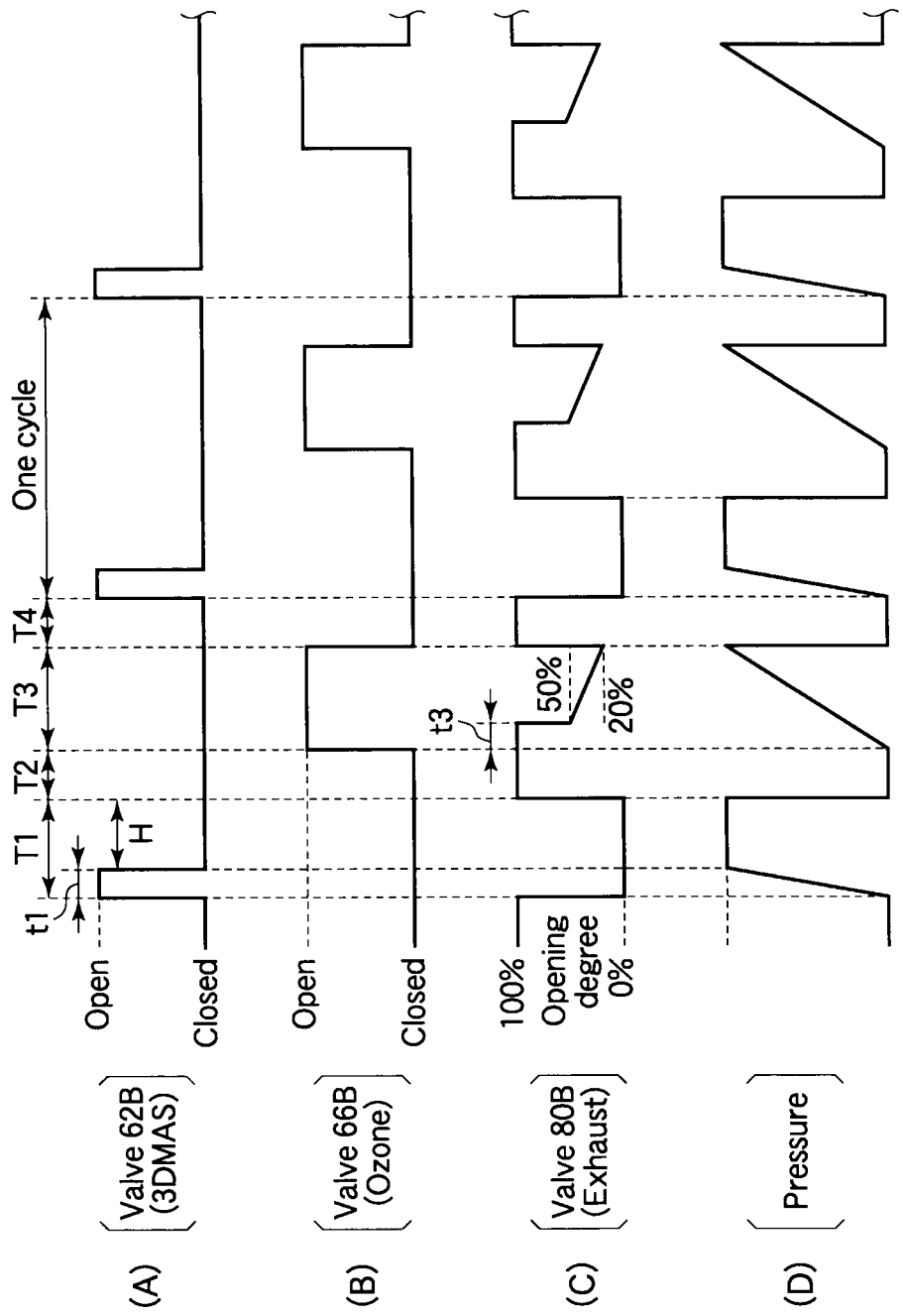
FIG. 2 is a graph showing the relationship between the valve states and the pressure inside the process container where a silicon oxide film is formed by ALD using the apparatus shown in FIG. 1.

FIG. 2 is a graph showing the relationship between the valve states and the pressure inside the process container where a silicon oxide film is formed by ALD using the apparatus shown in FIG. 1. FIG. 2, (A), shows the state of the switching valve 62B for the source gas, FIG. 2, (B), shows the state of the switching valve 66B for the reactive gas, FIG. 2, (C), shows the state of the exhaust valve 80B of the vacuum exhaust system (valve opening degree), and FIG. 2, (D), shows the pressure inside the process container.

As shown in FIG. 2, the film formation method according to this embodiment is arranged such that a cycle comprising an adsorption step T1, an exhaust step T3, a reaction step T2, and an exhaust step T4 in this order is repeated a plurality of times. The adsorption step T1 is arranged to set the switching valve 62B for the source gas open, as shown in FIG. 2, (A), to perform supply of the 3DMAS gas to adsorb decomposition products and so forth derived from this gas onto the surface of the wafers W. The reaction step T3 is arranged to set the switching valve 66B for the reactive gas open, as shown in FIG. 2, (B), to perform supply of the ozone gas to cause this gas to react with decomposition products and so forth adsorbed on the surface of the wafers, so as to form a thin $SiO_2$ film. Each of the exhaust steps T2 and T4 is arranged to exhaust gas from inside the process container 2 without supplying either of the 3DMAS gas and ozone gas. The vacuum pump 82 is kept running through all the steps T1 to T4.

A thin film having an atomic or molecular level thickness is formed by one cycle described above. Thin films formed by respective times of repetition of the cycle are laminated so that a product film having a predetermined thickness is formed. In one cycle, the time length of each of the adsorption step T1 and reaction step T3 is 2 to 120 seconds, such as about 60 seconds. The time length of each of the exhaust steps T2 and T4 is 2 to 20 seconds, such as about 10 seconds. The exhaust steps T2 and T4 may be excluded to improve the throughput of the film formation process.

More specifically, the adsorption step T1 is arranged, as shown in FIG. 2, (A), such that the switching valve 62B for the source gas is first set open for a predetermined period t1 and is then set closed, so that the source gas is supplied only for the predetermined period t1. At this time, as shown in FIG. 2, (C), the exhaust valve 80B of the vacuum exhaust system is kept closed throughout the entirety of the adsorption step T1. This adsorption step T1 differs from the adsorption step T11 of the conventional method, in which the exhaust valve 14B is kept open at a predetermined valve opening degree to vacuum-exhaust gas, as shown in FIG. 6, (C). Consequently, in this embodiment, the adsorption step T1 proceeds such that the source gas (3DMAS gas) is confined inside the process container 22 not to flow out, while the silicon source gas is adsorbed onto the surface of the wafers W. In this case, even if the flow rate of the source gas is low, adsorption of the source gas onto the surface of the wafers is promoted.

The time length of the predetermined period t1 described above is set to be 1 to 50%, and preferably of 5 to 30%, of the time length of the adsorption step T1 (for example, t1=2 to 60 seconds within the range relative to T1). If the predetermined period t1 is larger than 50%, the effect of reducing the source gas consumption becomes undesirably smaller. Further, the source gas is wasted because adsorption of the source gas onto the surface of the wafers is saturated. The flow rate of the source gas at this time is set to be about 10 to 500 sccm. In the adsorption step T1, the pressure inside the process container 22 is first quickly increased, and then becomes constant when the switching valve 62B for the source gas is closed. The pressure at this time is about 667 Pa, for example, though it depends on the flow rate of the source gas.

Then, after the adsorption step T1 is finished, the first exhaust step T2 starts. In this step, without supplying any of the gases, the exhaust valve 80B of the vacuum exhaust system is set totally open to quickly exhaust residual gas from inside the process container 22. However, at this time, $N_2$ gas serving as a purge gas may be supplied to promote removal of the residual gas. In the exhaust step T2, the pressure inside the process container 22 is quickly decreased (FIG. 2, (D)).

Then, the reaction step T3 starts. In this step, as shown in FIG. 2, (B), the switching valve 66B for the reactive gas is set open to supply the reactive gas or ozone throughout the entirety of the reaction step T3. At this time, as shown in FIG. 2, (C), the exhaust valve 80B of the vacuum exhaust system is first set open and then is set to gradually decrease its valve opening degree with progress of the reaction step T3. This reaction step T3 differs from the reaction step T13 of the conventional method, in which the exhaust valve 14B of the vacuum exhaust system is kept open at a valve opening degree of about 60%, as shown in FIG. 6, (C).

Consequently, the reactive gas or ozone gas reacts with the source gas or silicon source gas adsorbed on the surface of the wafers, and a thin film or silicon oxide film is thereby formed. In general, the ozone gas described above is generated from oxygen gas in an ozonizer, wherein $O_3$ gas is contained in $O_2$ gas by about 10 vol %, and such a gas mixture is practically used as an ozone-containing gas. In the reaction step T3, the exhaust valve 80B of the vacuum exhaust system is first kept totally open for a first predetermined period t3 from the exhaust step T2, and is then set to decrease its valve opening degree instantaneously to a predetermined level, such as 50%, and to further decrease its valve opening degree gradually and linearly to a predetermined level, such as 20%. In this case, the flow rate of the reactive gas or ozone is set at about 20 slm, which is far larger than the flow rate of the source gas described above.

In the case of the conventional method, as indicated by the point P1 shown in FIG. 6, (D), a quick pressure increase appears and brings about a prominent loading effect. On the other hand, the reaction step T3 of the method according to this embodiment is arranged such that the exhaust valve 80B of the vacuum exhaust system is set totally open only for the first predetermined period t3, and is then set to decrease its valve opening degree instantaneously to about 50% and to further decrease it gradually. Consequently, the pressure inside the process container 22 is prevented from rendering a quick increase, and is almost linearly and gradually increased, as shown in FIG. 2, (D). The maximum pressure during the reaction step is about 133 Pa (1 Torr), for example.

As described above, the reaction step T3 is arranged such that the exhaust valve 80B of the vacuum exhaust system is first set totally open, and is then set to gradually decrease its valve opening degree. In this case, the pressure is increased without causing a prominent loading effect, because it is possible to prevent a quick pressure increase, such as that indicated by the point P1, which brings about such a loading effect. Consequently, the reaction of the reactive gas or ozone with the silicon source gas adsorbed on the surface of the wafers is promoted. In other words, since there is no high pressure state, the ozone is prevented from being deactivated and prolongs its service life. Thus, the loading effect is suppressed and the deposition rate is kept high. Further, the planar uniformity of the film thickness on the surface of the wafers is kept high, and the throughput is improved.

The time length of the predetermined period t3 described above is set to be 1 to 50%, and preferably of 5 to 30%, of the time length of the reaction step T3 (for example, t3=2 to 60 seconds within the range relative to T3). If the predetermined period t3 is larger than 50%, an increase in the pressure inside the process container 22 is suppressed too much, and so the ozone reaction is deterred and the deposition rate becomes undesirably lower. It should be noted that the valve opening degrees 50% and 20% appearing halfway in the operation of the exhaust valve 80B of the vacuum exhaust system (FIG. 2, (C)) are mere examples. The optimum value of the valve opening degree is determined in light of the reaction rate of the ozone and silicon source gas. However, in the reaction step T3, the valve opening degree of the exhaust valve 80B is preferably set to have a maximum value (such as 100%) the same as the valve opening degree of the exhaust valve 80B used in the exhaust step T2, and a minimum value of 2% or more.

Then, after the reaction step T3 is finished, the second exhaust step T4 starts. In this step, without supplying any of the gases, the exhaust valve 80B of the vacuum exhaust system is set totally open to quickly exhaust residual gas from inside the process container 22. However, at this time, $N_2$ gas serving as a purge gas may be supplied to promote removal of the residual gas. In the exhaust step T2, the pressure inside the process container 22 is quickly decreased (FIG. 2, (D)). By doing so, one cycle of the film formation is finished. This cycle is repeated a plurality of times to form a thin film or silicon oxide film having a necessary film thickness.

In the embodiment described above, the valve opening degree 80B of the vacuum valve includes the totally open state (valve opening degree=100%) and the totally closed state (valve opening degree=0%). However, in the exhaust valve 80B practically used, where the valve opening degree is 90% or more, the exhaust conductance for the process container 22 is not changed so much but is almost the same as that obtained by the totally open state. Further, where the valve opening degree is 2% or less, the exhaust conductance for the process container 22 is not changed so much but is almost the same as that obtained by the totally closed state. Accordingly, in the embodiment described above, "the totally open state" of the exhaust valve 80B can be replaced with "a valve opening degree of 90 to 100%". Further "the totally closed state" of the exhaust valve 80B can be replaced with "a valve opening degree of 0 to 2%".

Further, in the embodiment described above, as shown in FIG. 2, (C), the exhaust valve 80B is set totally open only for the predetermined period t3 in the reaction step T3. FIGS. 3A and 3B are views showing two modifications of the reaction step, in terms of a change in the valve opening degree of the exhaust valve of the vacuum exhaust system. According to the modification shown in FIG. 3A, the valve opening degree is linearly changed from 100% to 50% in the predetermined period t3. According to the modification shown in FIG. 3B, the valve opening degree is linearly changed from 100% to 20% over the entire period of the reaction step. These modifications concerning a change in the valve opening degree are also mere examples.

Further, the valve opening degree may be changed along a curved or stepped line, such that the degree is changed stepwise a plurality of times, for example. One of the important points resides in that the valve opening degree of the exhaust valve 80B is set large at the beginning of the reaction step T3, so that the pressure inside the process container 22 is prevented from increasing at the beginning so as not to cause the loading effect. If necessary, the reaction step T3 may include supplying an inactive gas, such as $N_2$ gas or a rare gas, as a carrier gas together with the reactive gas.

As described above, according to the embodiment of the present invention, by use of the film formation apparatus 20 including the process container 22 configured to accommodate a plurality of target objects, such as semiconductor wafers W, the adsorption step and reaction step are alternately repeated with an intermediate period (the exhaust period) interposed therebetween to form a thin film on the target objects. In the adsorption step, while the exhaust valve 80B of the vacuum exhaust system 78 is kept closed, the switching valve 62B of the source gas supply system 54 is first set open for a predetermined period and then immediately set closed. By doing so, a source gas, such as 3DMAS gas serving as a silicon source gas, is temporarily supplied into the process container 22 to adsorb the source gas onto the target objects. In the reaction step, while the switching valve 66B of the reactive gas supply system 56 is kept open to supply the reactive gas into the process container 22, the exhaust valve 80B of the vacuum exhaust system 78 is first set open and is then set to gradually decrease its valve opening degree, so as to cause the reactive gas, such as ozone, react with the source gas. Consequently, it is possible to remarkably reduce the source gas consumption while maintaining the film quality at a high level and preventing the throughput from being lowered.

<Experiment>

In order to assess the batch CVD method according to the embodiment described above, an experiment was performed as follows. In a present example PE, a silicon oxide film was formed on wafers in the apparatus shown in FIG. 1 in accordance with the method shown in FIG. 2. In the present example PE, 3DMAS gas was used as the silicon source gas, and ozone gas (gas mixture of oxygen with 10 vol % ozone) was used as the reactive gas. The process temperature was set at 550° C., and the process pressure (the maximum value) was set at 1.2 kPa. The time length of the adsorption step T1 was set at different values, but the predetermined period t1 to set the switching valve 62B for the source gas open was fixed at 7 seconds. On the other hand, the time length of the reaction step T3 was fixed at 7 seconds, and the predetermined period t3 to set the exhaust valve 80B of the vacuum exhaust system totally open was fixed at 2 seconds. The time length of the adsorption step T1 was used as a parameter to change the time to set the switching valve 62B for the source gas closed in the adsorption step T1, i.e., the holding time H(=T1−t1).

Further, in a comparative example CE, a silicon oxide film was formed on wafers in the apparatus shown in FIG. 1 in accordance with the method shown in FIG. 6, under conditions the same as those of the present example PE except for the flow rate of 3DMAS gas and the operations of the valves. Specifically, in the comparative example CE, the flow rate of 3DMAS gas was set at 4 times lager than that of the present example PE, and the time length of the adsorption step was set at 30 seconds.

FIG. 4 is a graph showing results of this experiment. In FIG. 4, the horizontal axis denotes the holding time, and the vertical axis denotes the deposition rate per cycle. As shown in FIG. 4, the comparative example CE, in which the 3DMAS gas was supplied at X grams, rendered a deposition rate of about 0.13 nm/cycle. On the other hand, the present example PE rendered a deposition rate linearly improved with an increase in the holding time, even though the 3DMAS gas was supplied at a smaller value of X/4 grams. In this case, when the holding time was about 40 seconds, the deposition rate was almost the same as that of the comparative example CE. Accordingly, it was confirmed that, even though the source gas flow rate was decreased to ¼, the deposition rate was obtained at a value almost equal to or higher than that of the comparative example CE by setting the holding time at 40 seconds or more. In other words, it is possible to remarkably reduce the flow rate of the source gas while maintaining the deposition rate at a value almost equal to that of the comparative example CE, by operating the respective valves as in the method according to the embodiment of the present invention.

Further, the present example PE and comparative example CE described above were examined in terms of their loading effect, using patterned wafers. The term "a patterned wafer" means "a wafer provided with projections and recesses on the surface by forming part of circuit patterns". Since the gas consumption of patterned wafers is larger than flat wafers, the loading effect can prominently appear. As a result of this examination, the comparative example CE rendered a planar uniformity of about ±4.3% in film thickness on the patterned wafers. The present example PE rendered a planar uniformity of about ±3.8% in film thickness on the patterned wafers. Accordingly, it has been found that the planar uniformity in film thickness on patterned wafers can be improved by the method according to the embodiment of the present invention.

<Modifications>

In the embodiment described above, the silicon source gas is 3DMAS gas. Alternatively, the silicon source gas may be selected from other amino silane organic gases, such as BTBAS (bistertialbutylamino silane), 4DMAS (tetrakisdimethylamino silane), and DIPAS (diisopropylamino silane).

In the embodiment described above, the reactive gas is ozone gas serving as an oxidizing gas. Alternatively, the reactive gas may be selected from other oxidizing gases, such O$_2$, N$_2$O, and NO. Further, as disclosed in Jpn. Pat. Appln. KOKAI Publication No. 2005-175441, oxygen radicals and hydroxyl radicals generated under a low pressure of 133 Pa or less may be used.

In the embodiment described above, a silicon oxide film is formed by a batch CVD method. Alternatively, the present invention may be applied to a batch CVD method for forming another film, such as a silicon nitride film (SiN film) or silicon oxynitride film (SiON film). Where a silicon nitride film is formed, the silicon source gas may be DCS (dichloro silane), HCD (hexachloro disilane), or TCS (tetrachloro silane), and the reactive gas may be NH$_3$, for example. Where a silicon oxynitride film is formed, the silicon source gas may be an amino silane organic gas, and the reactive gas may be O$_3$, O$_2$, N$_2$O, NO, or NH$_3$, for example.

In the embodiment described above, a batch CVD method is performed in the batch processing apparatus that comprises the process container 22 having a double tube structure. Alternatively, the present invention may be applied to a batch processing apparatus that comprises a process container having a single tube structure.

As a target object, the semiconductor wafer mentioned here encompasses a silicon substrate and a compound semiconductor substrate, such as GaAs, SiC, or GaN. Further, the present invention may be applied to another target object, such as a glass substrate for LCD devices or a ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A batch CVD (chemical vapor deposition) method for a semiconductor process in a batch CVD apparatus, the apparatus comprising a vertically long process container configured to accommodate a plurality of target objects, a holder configured to support the target objects at intervals in a vertical direction inside the process container, a source gas supply system configured to supply a source gas into the process container, the source gas supply system including a source gas valve for adjusting supply of the source gas, a reactive gas supply system configured to supply a reactive gas into the process container, the reactive gas supply system including a reactive gas valve for adjusting supply of the reactive gas, and an exhaust system including a vacuum pump configured to exhaust gas from inside the process container and an exhaust valve for adjusting an exhaust rate, the method repeating a cycle a plurality of times to laminate thin films formed by respective times and thereby to form a product film having a predetermined thickness on the target objects, the cycle comprising, while keeping the vacuum pump running entirely through the cycle and using the exhaust valve based on definitions that a totally closed state and a totally open state of the exhaust valve are a valve opening degree of 0 to 2% and a valve opening degree of 90 to 100% thereof, respectively, an adsorption step of adsorbing the source gas onto the target objects, while supplying the source gas into the process container by first setting the source gas valve open for a first period and then setting the source gas valve closed, without supplying the reactive gas into the process container by keeping the reactive gas valve closed and without exhausting gas from inside the process container by keeping the exhaust valve in the totally closed state both entirely through the adsorption step;

then, a first intermediate step of removing residual gas from inside the process container, without supplying either of the source gas and the reactive gas into the process container by keeping both of the source gas valve and the reactive gas valve closed, while exhausting gas from inside the process container by setting the exhaust valve in the totally open state;

then, a reaction step of causing the reactive gas to react with the source gas adsorbed on the target objects, without supplying the source gas into the process container by keeping the source gas valve closed entirely through the reaction step, but starting supplying the reactive gas into the process container by setting the reactive gas valve open while exhausting gas from inside the process container by setting the exhaust valve in the totally open state, and then setting the exhaust valve to gradually decrease its valve opening degree from a predetermined open state to gradually increase pressure inside the process container while keeping on supplying the reactive gas into the process container and exhausting gas from inside the process container; and then, a second intermediate step of removing residual gas from inside the process container, without supplying either of the source gas and the reactive gas into the process container by keeping both of the source gas valve and the reactive gas valve closed, while exhausting gas from inside the process container by setting the exhaust valve in the totally open state, wherein the reaction step first sets the exhaust valve to gradually decrease its valve opening degree from the totally open state to the predetermined open state with a first decreasing rate for a second period, and then sets the exhaust valve to gradually decrease its valve opening degree from the predetermined open state with a second decreasing rate more moderate than the first decreasing rate after the second period.

2. The method according to claim 1, wherein the first and second intermediate steps includes supplying an inactive gas into the process container.

3. The method according to claim 1, wherein the first and second intermediate step excludes supplying any gas into the process container 4. The method according to claim 1, wherein the first period has a length within a range of 1 to 50% of that of the adsorption step.

5. The method according to claim 1, wherein the second period has a length within a range of 1 to 50% of that of the reaction step.

6. The method according to claim 1, wherein the reaction step excludes setting the exhaust valve in the totally closed state.

7. The method according to claim 1, wherein the reaction step excludes setting the reactive gas valve closed.

8. The method according to claim 1, wherein the adsorption step has a time length of 2 to 120 seconds, the reaction step has a time length of 2 to 120 seconds, and each of the first and second intermediate steps has a time length of 2 to 20 seconds.

9. The method according to claim 8, wherein the first period has a time length of 2 to 60 seconds within a range of 1 to 50% of that of the adsorption step.

10. The method according to claim 8, wherein the second period has a time length of 2 to 60 seconds within a range of 1 to 50% of that of the reaction step.

11. The method according to claim 1, wherein the product film is one selected from the group consisting of a silicon oxide film, a silicon oxynitride film, and a silicon nitride film.

12. The method according to claim 11, wherein the source gas comprises a silicon source gas selected from the group consisting of trisdimethylamino silane, bistertialbutylamino silane, tetrakisdimethylamino silane, diisopropylamino silane, dichloro silane, hexachloro disilane, and tetrachloro silane.

13. The method according to claim 11, wherein the reactive gas comprises a gas selected from the group consisting of $O_3$, $O_2$, $N_2O$, NO, and $NH_3$.

14. The method according to claim 1, wherein the product film is silicon oxide film, the source gas comprises a silicon source gas selected from the group consisting of trisdimethylamino silane, bistertialbutylamino silane, tetrakisdimethylamino silane, and diisopropylamino silane, and the reactive gas comprises a gas mixture of $O_3$ and $O_2$.

15. A non-transitory computer readable storage medium containing program instructions for execution on a processor, which, when executed by the processor, control a batch CVD apparatus to perform a method according to claim 1.

* * * * *